US007788608B2

(12) United States Patent
Huynh et al.

(10) Patent No.: US 7,788,608 B2
(45) Date of Patent: Aug. 31, 2010

(54) MICROBUMP FUNCTION ASSIGNMENT IN A BUCK CONVERTER

(75) Inventors: Steven Huynh, Sunnyvale, CA (US); David J. Kunst, Cupertino, CA (US)

(73) Assignee: Active-Semi, Inc. (VG)

( * ) Notice: Subject to any disclaimer, the term of this patent is extended or adjusted under 35 U.S.C. 154(b) by 265 days.

(21) Appl. No.: 11/978,458

(22) Filed: Oct. 29, 2007

(65) Prior Publication Data
US 2008/0084682 A1 Apr. 10, 2008

Related U.S. Application Data

(63) Continuation-in-part of application No. 11/544,876, filed on Oct. 7, 2006, now Pat. No. 7,581,198, and a continuation-in-part of application No. 11/888,441, filed on Jul. 31, 2007.

(60) Provisional application No. 60/850,359, filed on Oct. 7, 2006.

(51) Int. Cl.
*G06F 17/50* (2006.01)
(52) U.S. Cl. .............................. 716/1; 716/10
(58) Field of Classification Search .......... 716/1–3, 716/7–14, 16, 17
See application file for complete search history.

(56) References Cited

U.S. PATENT DOCUMENTS

| 5,880,598 | A  | * | 3/1999 | Duong ..................... 326/41 |
| 6,609,195 | B2 | * | 8/2003 | Dover ..................... 713/100 |
| 7,032,190 | B2 | * | 4/2006 | Auracher et al. ............... 716/1 |
| 7,392,498 | B1 | * | 6/2008 | Srinivasan et al. ............ 716/16 |
| 2007/0201797 | A1 | * | 8/2007 | Grzybowski et al. .......... 385/52 |

OTHER PUBLICATIONS

Texas Instruments TPS62000 Family Datasheet (SLVS294D) entitled "High Efficiency Step-Down Low Power DC-DC Converter" (Sep. 2000, revised Mar. 2006).

* cited by examiner

*Primary Examiner*—Vuthe Siek
(74) *Attorney, Agent, or Firm*—Imperium Patent Works; T. Lester Wallace; Darien K. Wallace

(57) ABSTRACT

An integrated circuit includes a buck converter controller, a PFET, an NFET that is coupled in common drain configuration to the PFET, a first microbump that is connected to the source of the PFET, a second microbump that is connected to the source of the NFET, a third microbump that is connected to the common drain node, a fourth microbump that is connected to a feedback input lead of the controller, and a plurality of other microbumps. The other microbumps are utilized to supply signals to and/or to conduct signals from the controller. A respective one of the four microbumps is disposed to occupy a respective one of the four corners of a square pattern. The other microbumps are disposed in a regular grid along with the four microbumps, but none of the other microbumps is disposed between any two of the four microbumps.

27 Claims, 5 Drawing Sheets

NOVEL FUNCTIONAL SEPARATION

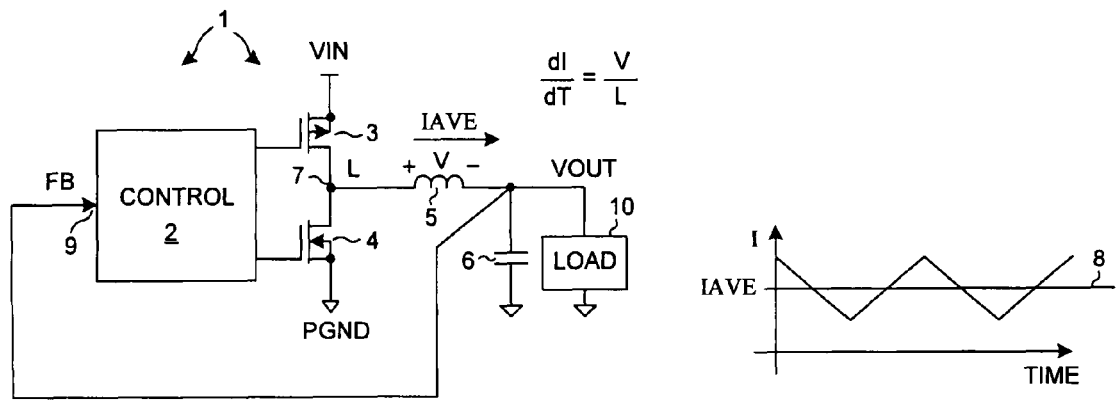
BUCK CONVERTER
(PRIOR ART)
FIG. 1
(PRIOR ART)
FIG. 2
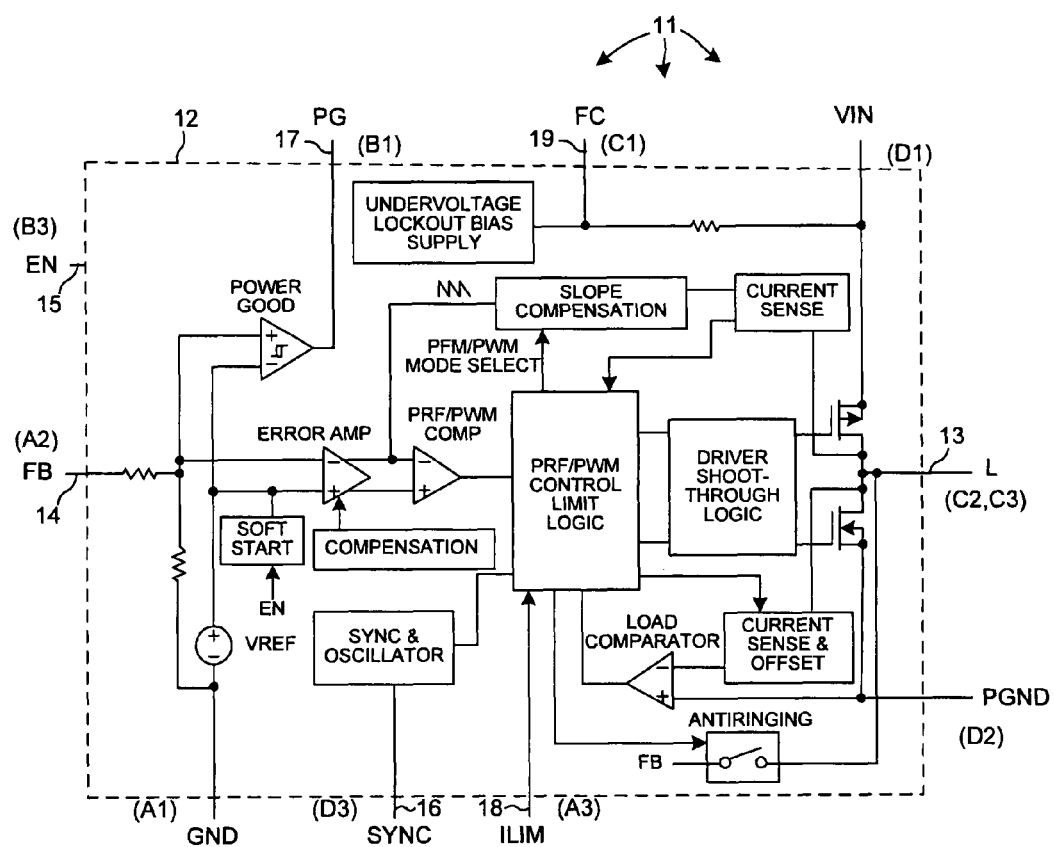
(PRIOR ART)
FIG. 3

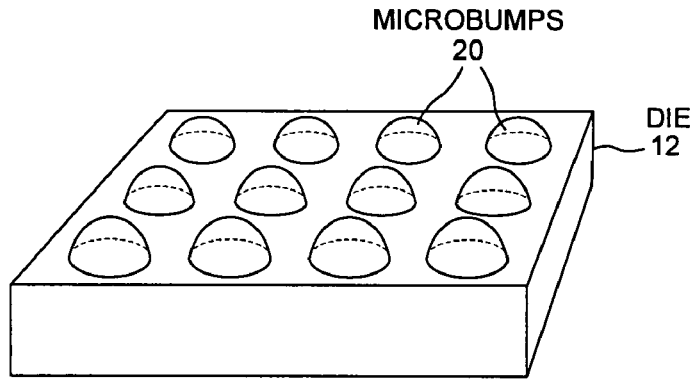
CHIP SCALE PACKAGE
(PRIOR ART)
FIG. 4
| FUNCTION | TERMINAL LOCATION |
|---|---|
| GND | A1 |
| FB | A2 |
| ILIM | A3 |
| PG | B1 |
| NC | B2 |
| EN | B3 |
| FC | C1 |
| L | C2 |
| L | C3 |
| VIN | D1 |
| PGND | D2 |
| SYNC | D3 |
(PRIOR ART)
FIG. 5
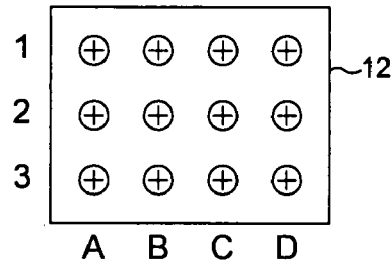
(PRIOR ART)
FIG. 6

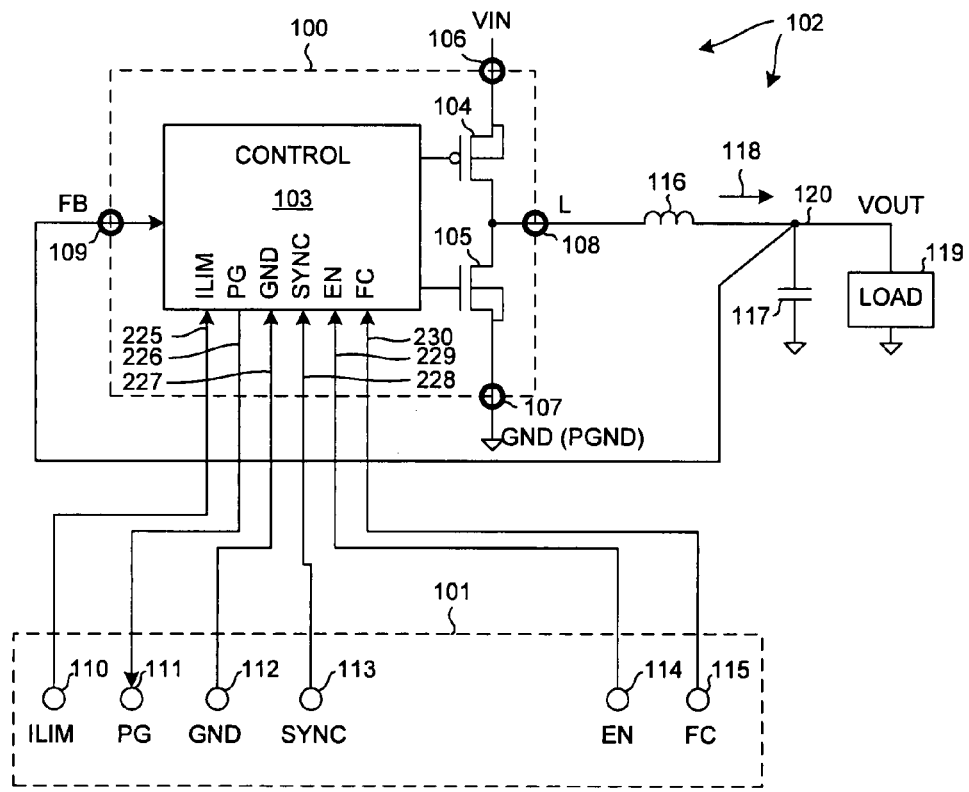
NOVEL FUNCTIONAL SEPARATION
FIG. 7
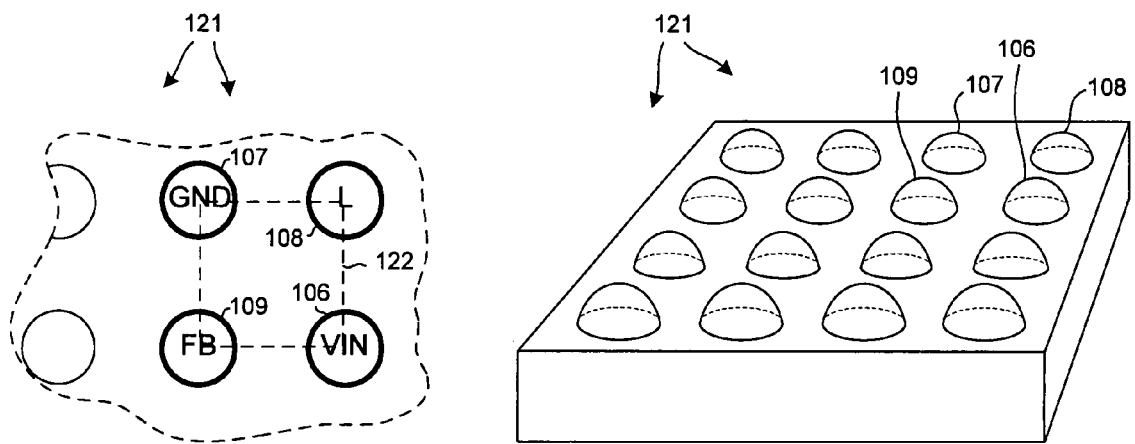
FIG. 8
FIG. 9

| FUNCTION | TERMINAL LOCATION |
|---|---|
| VIN (237) | A1 |
| GND (238) | A2 |
| ILIM (110) | A3 |
| PG (111) | A4 |
| DAT (239) | B1 |
| CLK (240) | B2 |
| GND (112) | B3 |
| SYNC (113) | B4 |
| <u>GND (107)</u> | <u>C1</u> |
| <u>FB (109)</u> | <u>C2</u> |
| EN (114) | C3 |
| FC (115) | C4 |
| <u>L (108)</u> | <u>D1</u> |
| <u>VIN (106)</u> | <u>D2</u> |
| "NC" | D3 |
| "NC" | D4 |

MICROBUMP FUNCTION ASSIGNMENT IN A BUCK CONVERTER

CROSS REFERENCE TO RELATED APPLICATION

This application is a continuation-in-part of, and claims priority under 35 U.S.C. §120 from, nonprovisional U.S. patent application Ser. No. 11/544,876, entitled "Method and System for the Modular Design and Layout of Integrated Circuits," now U.S. Pat. No. 7,581,198, filed on Oct. 7, 2006. This application is also a continuation-in-part of, and claims priority under 35 U.S.C. §120 from, nonprovisional U.S. patent application Ser. No. 11/888,441, entitled "Memory Structure Capable of Bit-Wise Write or Overwrite," filed on Jul. 31, 2007, which in turn claims the benefit under 35 U.S.C. §119 of provisional application Ser. No. 60/850,359, entitled "Single-Poly EEPROM Structure For Bit-Wise Write/Overwrite", filed Oct. 7, 2006. The subject matter of each of Ser. No. 11/544,876, Ser. No. 11/888,441 and Ser. No. 60/850,359 is incorporated herein by reference in its entirety.

TECHNICAL FIELD

The present invention relates generally to Chip Scale Package (CSP) implementations of buck converters.

BACKGROUND INFORMATION

FIG. 1 (Prior Art) is a block diagram of a type of direct current to direct current (DC-DC) converter 1 called a buck converter. There are several types of buck converters, but the example illustrated includes a synchronous pulse width modulation controller 2, a P-channel field effect transistor 3 (PFET), an N-channel field effect transistor 4 (NFET), an inductor 5, and a capacitor 6. Controller 2 controls the PFET and NFET such that only one of the two switches is conductive at a time. If PFET 3 is conductive, then supply voltage VIN is coupled to node 7 and the current in inductor 5 rises linearly. When NFET 4 is conductive, node 7 is coupled to PGND (ground) and the current in inductor 5 decreases linearly.

FIG. 2 (Prior Art) is a diagram that illustrates current flow in inductor 5. The average inductor current IAVE is indicated by line 8. As is well understood in the art, the output voltage VOUT across load 10 is approximately equal to the supply voltage VIN multiplied by the duty cycle (conductive time versus nonconductive time) of the high side switch PFET 3. Controller 2 monitors VOUT via its feedback (FB) input terminal 9 and controls the duty cycle of PFET 3 such that IAVE delivered to load 10 causes the voltage VOUT to be regulated to the desired voltage.

FIG. 3 (Prior Art) is an example of a conventional integrated circuit 11 that is available on the market to realize a buck converter. Dashed line 12 represents the edge of the integrated circuit. To use integrated circuit 11, the terminal 13 (L) is coupled to a first terminal of an external inductor as in the example of FIG. 1. The second terminal of the external inductor is coupled to the feedback input terminal 14 as in the example of FIG. 1. The second terminal of the inductor is also coupled to a load. A capacitor is connected between the second terminal of the inductor and ground potential as in the example of FIG. 1. The specific buck converter integrated circuit 11 of FIG. 3, however, also has other terminals and functionalities. For example, the buck converter can be disabled by placing an appropriate digital value on an EN input terminal 15. The switching of the PFET and NFET can be made synchronous to an external clock signal. If a digital clock signal is provided on an input terminal 16 (SYNC), then this clock signal is used to synchronize the switching of the PFET and NFET. If, however, there is no clock signal present on SYNC terminal 16, then a clock signal generated on the integrated circuit 11 is used as a time base to switch the PFET and NFET. If the integrated circuit 11 determines that it is regulating the output voltage across the load in an acceptable fashion, then it asserts a digital one-bit signal on an output terminal 17 (PG). If the integrated circuit 11 determines that it is not regulating the output voltage in this acceptable fashion, then integrated circuit 11 deasserts the digital one-bit signal on the PG output terminal 17. The integrated circuit 11 may be made to drive the load to have one of two maximum current limit values. If a digital value on input terminal 18 (ILIM) is set to a first digital logic value, then the first predetermined current limit is used, otherwise if the digital value on input terminal ILIM 18 is set to a second digital logic value, then the second predetermined current limit is used. An external capacitor is to be coupled to terminal 19 (FC) so that the supply voltage for the undervoltage lockout bias supply circuit is a filtered voltage.

The integrated circuit 11 can be used in many different applications by configuring its various inputs and using its various outputs appropriately. For additional details, see the SLVS294D datasheet, September 2000, revised March 2006, for the TPS62000 family of DC-DC converters available from Texas Instruments of Dallas, Tex.

FIG. 4 (Prior Art) is a perspective view of the versatile buck converter integrated circuit 11 of FIG. 3. Rather than the semiconductor die being packaged in an integrated circuit package with leads, the upper surface of the die is provided with twelve microbumps 20. Each microbump is one terminal. Die 12 is then surface mounted directly to a printed circuit board, such that the microbumps 20 on the face side of die 12 are soldered directly to corresponding pads on the printed circuit board. A die provided with microbumps in this fashion is said to be "chip scale packaged" or in a "chip scale package" (CSP).

SUMMARY

FIG. 5 (Prior Art) is a table illustrating a correspondence between the terminals of integrated circuit die 12 and the functions of the various terminals. A terminal in the table of FIG. 5 is identified by its location on the face side of die 12. As can be seen from FIG. 4, there are three rows of microbumps where each row includes four microbumps. There are four columns of microbumps. FIG. 6 (Prior Art) indicates the row and column numbering convention used in the table of FIG. 5. Although the architecture of the integrated circuit 11 of FIGS. 3-6 works well in many applications and allows the integrated circuit 11 to be used in many applications, an improved architecture is desired.

A Chip Scale Package (CSP) buck converter integrated circuit includes a general purpose and configurable buck converter controller, a high-side switch (for example, a P-channel field effect transistor (PFET)), a low-side switch (for example, an N-channel field effect transistor (NFET)) that is coupled in common drain configuration to the PFET, a first microbump (VIN) that is connected to the source of the PFET, a second microbump (GND) that is connected to the source of the NFET, a third microbump (L) that is connected to the common drain node, a fourth microbump (FB) that is connected to a feedback input lead of the controller, and a plurality of other microbumps. The term "microbump" here refers to a surface mount terminal structure on the top major surface of the CSP integrated circuit. The structure is later directly surface-mount bonded to a printed circuit board (PCB) or other structure. Other terms including "bond ball", "solder ball" and "bump" are sometimes used rather than the term "microbump".

Each respective one of the four microbumps is located to occupy a respective one of the four corners of a square pattern on the major top surface of the integrated circuit die. The other microbumps that have functionalities associated with the buck converter are disposed in a regular grid along with the four microbumps, but none of the other microbumps is disposed between any two of the four microbumps. The other microbumps may be used to supply signals to and/or to conduct signals from the buck controller. Certain of the other microbumps may, for example, be used to communicate configuration and control information to the buck converter controller to configure the controller. Certain of the other microbumps may, for example, be used to couple external components (external to the integrated circuit) to the functional circuitry within the integrated circuit.

Placement of the four microbumps (VIN, GND, L and FB) in the square pattern as set forth above facilitates use of the general purpose and configurable buck tile in the design and layout of a CSP buck converter integrated circuit. In one example, the general purpose and configurable buck tile has a rectangular shape (for example, a square shape) and includes the four microbumps disposed in the square pattern set forth above. Due to the rectangular shapes of the buck tile and other neighboring tiles, the buck tile can be placed adjacent to other rectangular tiles (for example, a master tile and general purpose input/output (GPIO) tiles) during the integrated circuit layout process. The tiles are designed such that when the rectangular tiles are placed adjacent one another, local interconnect bus structures in the various tiles link up with one another to form a large interconnect structure that connects all the tiles of the integrated circuit together. This large interconnect bus structure is usable to supply configuration information to the various tiles, to configure the functional circuitry in the various tiles, to configure the interconnect bus so that a specific circuitry within one tile can be interconnected through the interconnect bus structure to another specific circuit in another tile. The large interconnect bus structure is also usable to provide electrical signal paths between specific circuitry in specific tiles and specific microbumps.

Although the novel separation of the microbumps having the four functionalities set forth above (VIN, GND, L, and FB) and placement of these four microbumps in a square facilitates a tiled buck converter design, the novel microbump configuration need not only be implemented in a tiled architecture. In one example, the novel microbump configuration is retained and employed by a non-tiled replacement integrated circuit that is designed to be a "pin-for-pin" drop in replacement for an original tiled buck converter integrated circuit design.

Other structures and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 1 (prior art) is a diagram of a conventional buck converter circuit.

FIG. 2 (prior art) is a diagram of inductor current in the buck converter circuit of FIG. 1.

FIG. 3 (prior art) is a diagram of a commercially available Chip Scale Package integrated circuit usable for realizing the buck converter circuit of FIG. 1.

FIG. 4 is a diagram of the Chip Scale Package microbump layout of the commercially available integrated circuit of FIG. 3.

FIG. 5 (prior art) is a table that sets forth the functions of the various microbumps of the Chip Scale Package device of FIGS. 3 and 4.

FIG. 6 (prior art) is simplified top-down diagram of the Chip Scale Package integrated circuit of FIGS. 3-5.

FIG. 7 is a diagram that illustrates a novel functional separation of microbump functionalities in accordance with one novel aspect.

FIG. 8 is a top-down diagram of a part of a top major surface of a novel CSP integrated circuit 121 that employs the novel functional separation illustrated in FIG. 7.

FIG. 9 is perspective view of the integrated circuit 121 of FIG. 8.

DETAILED DESCRIPTION

Figure 10:
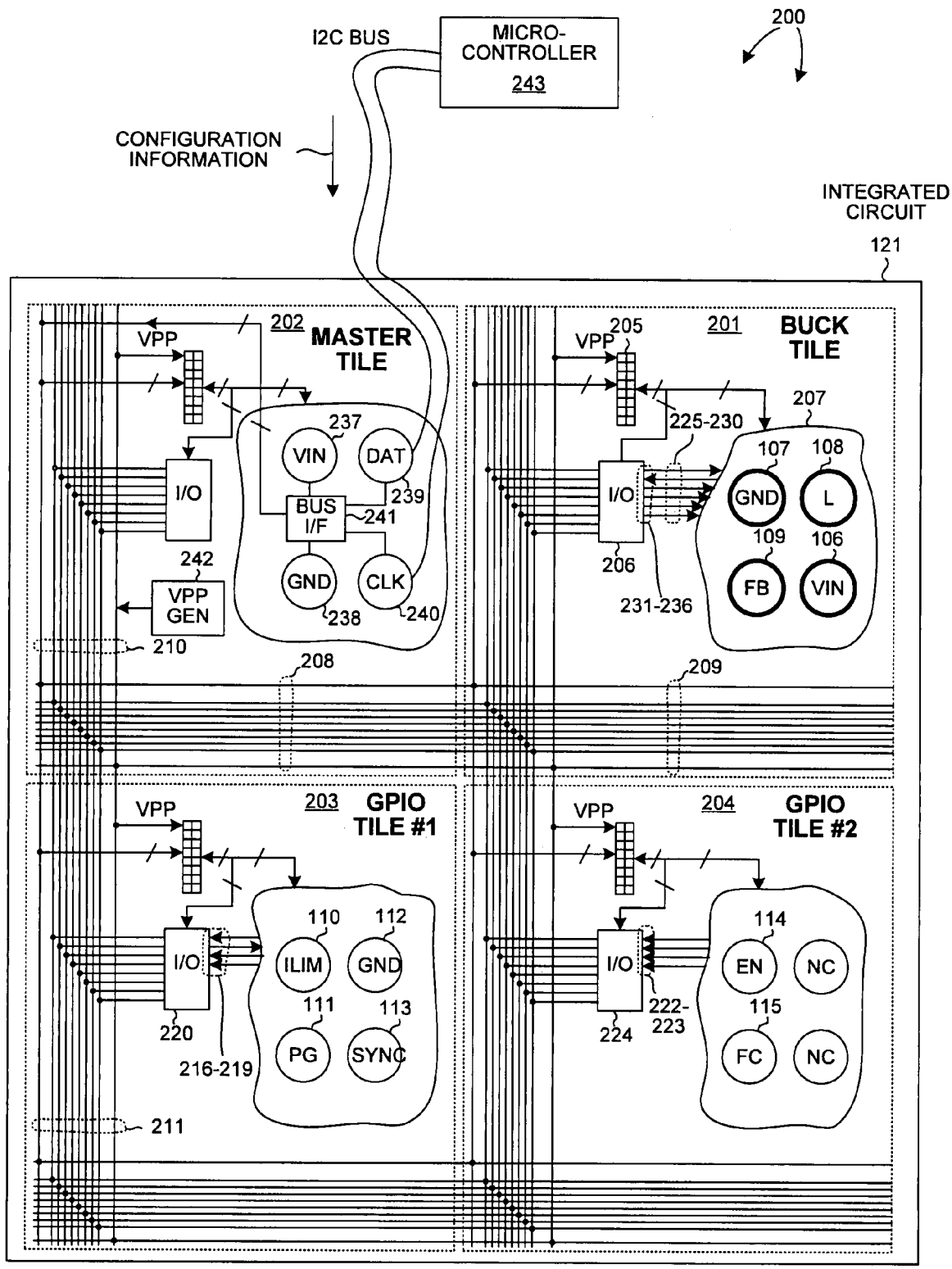
FIG. 10 is simplified top-down schematic circuit diagram of the integrated circuit 121 of FIGS. 8 and 9. The integrated circuit has a novel tiled architecture that employs a novel programmable general purpose buck tile.

Reference will now be made in detail to some embodiments of the invention, examples of which are illustrated in the accompanying drawings.

FIG. 7 is a diagram in accordance with one novel aspect. The functionality of the buck converter circuitry of the prior art buck converter of FIG. 3 is separated into a first portion 100 and a second portion 101. The buck converter 102 includes a controller portion (for example, a pulse width modulator portion) 103, a P-channel field effect transistor (PFET) 104, an N-channel field effect transistor (NFET) 105, ten microbump terminals 106-115, an inductor 116 and a capacitor 117. The output voltage VOUT on output node 120 is regulated in the same conventional buck converter fashion as the regulation practiced by the conventional buck converter integrated circuit of FIG. 3. The controller 103 controls the conductive time to nonconductive time (the duty cycle) of PFET 104 so as to regulate average current flow 118 delivered to load 119.

It is recognized that there are many different applications for buck converters, and many of the different applications require slightly different functionalities and input and output signals. It is also recognized, however, that all these buck converter applications involve a common set of terminals: 1) a switch terminal L that is connected to the common drain node between the PFET and the NFET, 2) a supply voltage terminal VIN through which the positive voltage supply is received that is supplied to the source of the PFET, 3) a ground terminal GND (also referred to as PGND) that is coupled to the source of the NFET, and 4) a feedback terminal FB through which the controller monitors the output node. In one novel aspect, these four terminals are realized as microbumps and are disposed adjacent one another in a square pattern on a major surface of an integrated circuit die.

FIG. 8 is a top-down simplified diagram of a part of the face side of Chip Scale Package (CSP) integrated circuit die 121. The face side of die 121 is one of two larger sides of the die and is referred to as a "major" surface of the die. The four microbumps 106-109 of first portion 100 of FIG. 7 are disposed such that a respective one of the four microbumps is disposed at each respective corner of a square pattern 122. There are no other microbumps disposed on the major surface within square 122.

FIG. 9 is a perspective view of integrated circuit die 121. The four microbumps 106-109 are disposed in the square pattern in the upper right corner of the die 121. The other microbumps of the circuit of FIG. 7 are disposed outside the square.

Figures 11, 12:
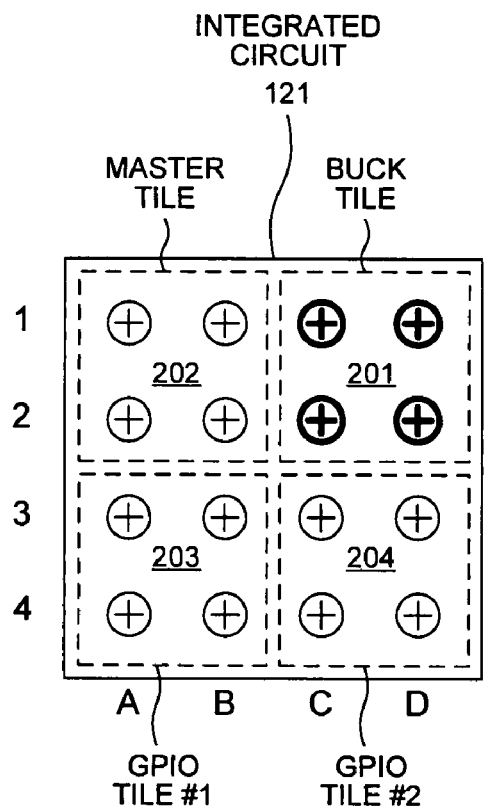
FIG. 11 is a top-down diagram of the novel CSP integrated circuit 121 of FIGS. 8-10.
FIG. 12 is a table that sets forth the functions of the various microbumps of the integrated circuit 121 of FIGS. 8-11.

FIGS. 10-12 are diagrams that illustrate how the buck converter functionality of the circuit of FIG. 7 is realized to take advantage of the novel microbump layout pattern of FIG. 8. Due at least in part to the separation of the functionalities of the four microbumps 106-109, a novel tile architecture is used, where one of the tiles is a configurable general purpose buck converter tile.

FIG. 10 is a diagram of a system 200 involving one example of integrated circuit die 121 in which the novel tile architecture was employed. Integrated circuit die 121 includes four tiles: a configurable general purpose buck tile 201, a master tile 202, and two general purpose input/output tiles 203 and 204. Each tile includes an interconnect bus portion, an input/output interface portion, a memory portion, a functional portion, and a set of four microbumps. Buck tile 201, for example, includes memory portion 205, input/output interface portion 206, a functional portion 207, and the four microbumps 106-109. The functional portion 207 of buck tile 201, if configured properly, implements the circuitry within dashed box 100 of FIG. 7. As is evident from FIG. 10, the tiles have a layout and are disposed with respect to each other on a regular grid such that the interconnection bus portion of one tile links up with the interconnection bus portion of an adjacent tile. For example, the horizontally extending bus conductors 208 of master tile 202 link up with the horizontally extending bus conductors 209 of the adjacent buck tile 201. Similarly, the vertically extending bus conductors 210 of master tile 202 link up with the vertically extending bus conductors 211 of the adjacent GPIO tile 203.

The interface portion of a tile includes a set of multiplexers and demultiplexers. The multiplexers and demultiplexers can be controlled to couple a desired one of the vertically extending conductors in the interconnection bus to a desired one of a set of nodes. The functional circuitry is fashioned such that a signal conductor that is either to receive information from another tile or that is to output information to another tile is coupled to this node. By appropriate control of the multiplexers and demultiplexers in the interface portion, the signal conductor of the functional circuitry is coupled through the interface portion to a desired one of the vertically extending conductors of the interconnection bus. Due to the way the conductors of the interconnection bus are interconnected from tile to adjacent tile, in both the vertical and horizontal dimensions, the desired conductor extends to all the interface portions of all the tiles of the die. The interface portion of another tile can therefore be configured to couple the conductor to a desired node of functional circuitry within the other tile.

In the specific example of FIG. 10, each, respective one of the microbumps 110-113 of GPIO tile 203 is connected to a corresponding one of the nodes 216-219 on interface portion 220. Similarly, each respective one of the microbumps 114-115 of GPIO tile 204 is connected to a corresponding one of the nodes 222-223 on interface portion 224. The signal conductors 225-230 (also see FIG. 7) of the functional circuitry of buck tile 201 are connected to respective corresponding ones of the nodes 231-236 on interface portion 206. The memory portion of each tile stores configuration information in non-volatile memory cells. This configuration information is supplied to and from the tile's functional circuitry to control the functional circuitry, and to the interface portion of the tile to control how the multiplexers and demultiplexers within the interface portion are configured. Accordingly, by changing the contents of the configuration information stored in the memory portions, the configuration of the multiplexers and demultiplexers in the interface portions of integrated circuit 121 can be changed.

In the illustrated example of FIG. 10, the memory portions of die 121 are loaded with configuration information such that: 1) ILIM microbump 110 of GPIO tile 203 is coupled through interface portion 220 and interface portion 206 to node 231 of interface portion 206 and then on to signal conductor 225 of functional circuitry portion 207 of buck tile 201; PG microbump 111 of GPIO tile 203 is coupled through interface portion 220 and interface portion 206 to node 232 of interface portion 206 and then on to signal conductor 226 of functional circuitry portion 207 of buck tile 201; GND microbump 112 of GPIO tile 203 is coupled through interface portion 220 and interface portion 206 to node 233 of interface portion 206 and then on to signal conductor 227 of functional circuitry portion 207 of buck tile 201; SYNC microbump 113 of GPIO tile 203 is coupled through interface portion 220 and interface portion 206 to node 234 of interface portion 206 and then on to signal conductor 228 of functional circuitry portion 207 of buck tile 201; EN microbump 114 of GPIO tile 204 is coupled through interface portion 224 and interface portion 206 to node 235 of interface portion 206 and then on to signal conductor 229 of functional circuitry portion 207 of buck tile 201; and FC microbump 115 of GPIO tile 204 is coupled through interface portion 224 and interface portion 206 to node 236 of interface portion 206 and then on to signal conductor 230 of functional circuitry portion 207 of buck tile 201.

The memory portions of the various tiles are loaded with configuration information through master tile 202. The master tile 202 includes a input supply voltage VIN microbump 237, a ground GND microbump 238, a data DAT microbump 239, a clock signal input CLK microbump 240, an associated bus interface block 241, and a programming voltage generator circuit 242. The master tile also provides VREF, CLK and other shared resources, which, are supplied to all tiles via the standard interconnect bus. In one example, after manufacture of the integrated circuit but before shipment to the customer, supply voltage and ground potentials are coupled to the VIN and GND microbumps, respectively. This VIN voltage powers bus interface circuitry block 241 and programming voltage generator 242. The DAT and CLK microbumps are coupled to a microcontroller 243 or other processor or tester that has a I2C bus interface. The microcontroller 243 writes configuration information into the various memory portions of the various tiles by writing information across the I2C bus and into the bus interface block 241. A time multiplexed, address/data bus access scheme is employed.

In a first write, the microcontroller writes an address into the bus interface block 241. The bus interface block 241 places this address out onto the interconnection bus structure of die 121. The address is therefore presented to all the memory portions. Only one of the memory portions, however, is addressed by the address on the interconnection bus structure. Then in a second write the microcontroller writes eight bits of data across the I2C bus and through the bus interface block 241. This data is supplied across the interconnection bus structure to all the memory portions. Only the previously addressed memory portion, however, is written with the data. In this fashion, the external microcontroller 243 can write to each respective eight-bit register of the memory portions of die 121. Each memory portion may include many separately addressable eight-bit registers. As described above, the information written into the memory portions determines how the associated interface portions are configured. For additional detail on the tile structure of die 121, the composition of its tiles, the composition of its interconnect bus structure, how its tiles can be programmably configured, can be read from, and can be written to, see: 1) U.S. patent application Ser. No. 11/544,876, entitled "Method and System for the Modular Design and Layout of Integrated Circuits", now U.S. Pat. No. 7,581,198, filed Oct. 7, 2006, by Huynh et al.; 2) U.S. provisional application 60/850,359, entitled "Single-Poly EEPROM Structure For Bit-Wise Write/Overwrite", filed Oct. 7, 2006; and 3) U.S. patent application Ser. No. 11/888,441, entitled "Memory Structure Capable of Bit-Wise Write or Overwrite", filed Jul. 31, 2007, by Grant et al. (the subject matter of each of these three patent documents is incorporated herein in its entirety).

Buck tile 201 is a programmable general purpose buck tile. In addition to the specific input and output signal conductors 225-230 of FIG. 7, the control block 103 of the buck tile has other signal conductors that are usable to activate, control, enable and/or disable various other specialized functionalities of the general purpose buck tile. The functionalities provided by these other signal conductors are not used outside of the conventional circuit of FIG. 3 to be realized, so the corresponding other signal conductors are not made to be coupled out of the functional portion 207 of buck tile 201. These other signal conductors are simply hardwired to set the functions that they control into the appropriate condition to realize the conventional circuit of FIG. 3. The signal conductors 225-230 are, however, coupled through the interconnection bus structure of die 121 to associated microbumps 110-115. The functionalities related to these signal conductors 225-230 is therefore explained briefly here.

ILIM microbump 110 supplies a single digital bit to signal conductor 225 of the control block 103 in buck tile 201. If this single digital bit is a digital high, then control block 103 utilizes a first current limit value, whereas if the single digital bit is a digital low, then control block 103 utilizes a second current limit. The current limit is a maximum amount of current that the buck converter will supply to the load. The first and second current limit values are stored in non-volatile memory cells in eight-bit registers of memory portion 205. The values of these two current limit values is therefore settable through the I2C bus and the master tile.

PG microbump 111 is a microbump through which control block 103 supplies a single digital bit of digital information to circuitry outside integrated circuit 121. If control block 103 determines that the buck converter is regulating the voltage VOUT in accordance with a predetermined standard, then control block 103 causes the PG signal to be a digital logic high, otherwise control block 103 causes the PG signal to be a digital logic low.

GND microbump 112 is connected to the conductor 226 of the controller 103 of the buck tile. This ground is a relatively quiet signal ground used by the controller 103, as opposed to a relatively noisy ground PGND at the source of NFET 105. (In another embodiment, a "quiet" analog ground signal is provided by the master tile and is provided to all other tiles via the standard interconnect bus. The GND microbump 112 is provided in this embodiment of FIGS. 7-12 to provide easy interchangeability with the conventional CSP buck converter of FIG. 3.)

SYNC microbump 113 couples a single digital signal line to signal conductor 228 of control block 103 in buck tile 201. If control block 103 detects an oscillating digital signal on this signal conductor 228, then control block 103 uses the oscillating digital signal as a time base in the switching of PFET 104 and NFET 105. The switching of PFET 104 and NFET 105 is therefore said to be synchronized to the external digital clock signal. If, on the other hand, control block 103 does not detect an oscillating digital signal on this signal conductor 228, then control block 103 uses an oscillating signal generated on-chip by an internal oscillator within buck tile 201. This on-chip source is used as the time base for the switching of the PFET 104 and NFET 105. When an oscillating signal is not detected on SYNC microbump 113, the SYNC microbump is used to detect an externally supplied "mode" select signal. If the mode signal is a digital logic high then the "mode" is a forced PWM mode, whereas if the mode signal is a digital logic low then the "mode" is a PFM/PWM mode.

EN microbump 114 supplies a single digital bit to signal conductor 225 of control block 103 in buck tile 201. If this single digital bit is a digital logic high, then the buck converter is enabled. If, on the other hand, this single digital bit is a digital logic low, then the buck converter is disabled. Disabling of the buck converter is accomplished by keeping PFET 104 and NFET 105 in their nonconductive states.

FC microbump 115 is usable to couple an external capacitor to circuitry in buck tile 201. Buck tile 201 has two configurations. In a first configuration, the supply voltage VIN is coupled directly to some of the buck converter's control circuitry including the undervoltage lockout circuit. In a second configuration, a filtered version of the supply voltage VIN is coupled to the undervoltage lockout and other control circuitry. This configurability is realized by providing an analog multiplexer within the buck tile. VIN microbump 106 is coupled to a first input lead of the analog multiplexer. The output lead of the analog multiplexer is coupled to the undervoltage lockout bias supply circuit. The VIN microbump 106 is also coupled to one terminal of a resistor. The second terminal of the resistor is coupled both to signal conductor 236 as well as to a second input lead of the analog multiplexer. The user is to couple an external capacitor to the FC microbump 115, thereby forming an RC filter involving the external capacitor and the resistor. This RC filter filters the external supply voltage VIN before it is supplied onto the second input lead of the analog multiplexer. A configuration bit within memory portion 205 of buck tile 201 controls which one of the two input leads the analog multiplexer couples to the analog output lead. This configuration bit, like all bits of the memory portion 205, is settable by microcontroller 243 through the I2C bus and the master tile.

FIG. 11 is a top-down diagram of buck converter integrated circuit die 121. The VIN, GND (PGND), L and FB microbump functions are separated from the other microbump functions, and are advantageously disposed in a square pattern. In the illustrated example, the square is in the upper right corner of integrated circuit 121. FIG. 12 is a table that sets forth, for each of the microbumps illustrated in FIG. 11, its corresponding function. In the table of FIG. 12, the number in the parenthesis beside each function name is the reference numeral of the corresponding microbump in FIG. 10. Due to the novel separation of the four particular microbump functions described above, a general purpose and configurable buck tile can be used to realize many different buck converter integrated circuits including integrated circuit 121. Once a particular tiled integrated circuit utilizing the buck tile has been fabricated, the integrated circuit can be used in a prototype or early version of a larger system being developed. Use of the tiled architecture speeds the design process because particular tiles (such as the programmable general purpose buck tile) previously designed for other applications can often be reused in the new integrated circuit design with a relatively small amount of additional customization. Once the tiled integrated circuit is in use in the larger system, another integrated circuit having the same functionality and microbump functional assignments as the tiled integrated circuit can be designed. Design of the new integrated circuit need not generally be done in haste, however, and can therefore employ more time consuming full custom layout techniques that allow the resulting integrated circuit to be compact and to occupy less semiconductor die area than the tile-architecture predecessor device. Because the resulting new integrated circuit is smaller than the tiled earlier version, the new integrated circuit may have a lower fabrication cost. The new integrated circuit can be a drop-in replacement for the tiled version in subsequent high volume production of the larger system. The novel microbump functional assignment that gave rise to the initial design, however, remains in the replacement integrated circuit. If the buck converter controller is not laid out as a tile, a signal distribution layer can be provided on the integrated circuit die, where the signal distribution layer couples appropriate nodes on the buck converter controller to appropriate ones of the four microbumps that are arranged in the square pattern on the major surface of the die. Such a redistribution layer may be realized in upper metal layers of the integrated circuit die.

Although the present invention is described in connection with certain exemplary embodiments, the present invention is not limited thereto. Although the four microbumps are advantageously arranged in a square pattern, significant benefit may be obtained by organizing the microbumps to occupy the corners of a parallelogram shape or diamond shape provided that there are no other microbumps between the four microbumps (VIN, GND, L and FB). Although the high side and low side switches of the buck converter are described as being field effect transistors, other types of switches are employed in other embodiments. Accordingly, various modifications, adaptations, and combinations of various features of the described embodiments can be practiced without departing from the scope of the invention as set forth in the claims.

What is claimed is:

1. An integrated circuit comprising:
    four microbumps disposed on a major surface of the integrated circuit, wherein the four microbumps are arranged in a square pattern such that one of the four microbumps is disposed at a respective corner of the square, and wherein there are no microbumps other than the four microbumps disposed on the major surface within the square;
    a buck converter having a P-channel transistor, an N-channel transistor, and a control circuit, wherein a first of the four microbumps is connected to a source of the P-channel transistor, wherein a drain of the P-channel transistor is connected to a drain of the N-channel transistor and to a second of the four microbumps, wherein a source of the N-channel transistor is connected to a third of the four microbumps, and wherein a fourth of the four microbumps is connected to a feedback input of the control circuit;
    additional microbumps disposed on the major surface of the integrated circuit, wherein the additional microbumps and the four microbumps are arranged on a regular grid, and wherein the buck converter receives control signals through the additional microbumps;
    a first interconnection bus portion; and
    a second interconnection bus portion, wherein the four microbumps, the buck converter and the first interconnection bus portion are part of a first tile of the integrated circuit, wherein the additional microbumps and the second interconnection bus portion are part of a second tile of the integrated circuit, and wherein the first interconnection bus portion links up with the second interconnection bus portion.

2. The integrated circuit of claim 1, wherein the integrated circuit is a Chip Scale Package (CSP) device.

3. The integrated circuit of claim 1, wherein one of the additional microbumps receives a signal that determines a current limit of the buck converter.

4. The integrated circuit of claim 1, further comprising:
    a microbump that outputs a signal that indicates when a regulated voltage on the second microbump meets a predetermined criteria.

5. The integrated circuit of claim 1, wherein one of the additional microbumps receives a clock signal that is supplied to the buck converter.

6. The integrated circuit of claim 1, further comprising:
    a non-volatile memory that stores configuration information that configures the buck converter.

7. The integrated circuit of claim 1, wherein one of the additional microbumps receives an enable signal that enables the buck converter.

8. The integrated circuit of claim 1, further comprising:
    a plurality of bits of non-volatile memory, wherein the bits of non-volatile memory store a plurality of bits of configuration information, and wherein the bits of configuration information determine whether one of the additional microbumps is coupled to the buck converter.

9. The integrated circuit of claim 1, wherein the buck converter is configurable, and wherein signals received on the additional microbumps determine how the buck converter is configured.

10. The integrated circuit of claim 1, wherein the second of the four microbumps is coupled to a first lead of an inductor, and wherein the fourth of the four microbumps is coupled to a second lead of the inductor.

11. The integrated circuit of claim 1, further comprising:
    means for storing configuration information that configures the buck converter.

12. The integrated circuit of claim 1, further comprising:
    means for configuring the buck converter via signals received onto the additional microbumps.

13. The integrated circuit of claim 1, further comprising:
    means for receiving a signal onto one of the additional microbumps wherein the signal determines a current limit of the buck converter.

14. An integrated circuit comprising:
    four microbumps disposed on a major surface of the integrated circuit, wherein the four microbumps are arranged in a square pattern such that one of the four microbumps is disposed at a respective corner of the square, and wherein there are no microbumps other than the four microbumps disposed on the major surface within the square;
    a buck converter having a P-channel transistor, an N-channel transistor, and a control circuit, wherein a first of the four microbumps is connected to a source of the P-channel transistor, wherein a drain of the P-channel transistor is connected to a drain of the N-channel transistor and to a second of the four microbumps, wherein a source of the N-channel transistor is connected to a third of the four microbumps, and wherein a fourth of the four microbumps is connected to a feedback input of the control circuit; and
    additional microbumps disposed on the major surface of the integrated circuit, wherein the additional microbumps and the four microbumps are arranged on a regular grid, wherein the buck converter receives control signals through the additional microbumps, wherein the four microbumps and the additional microbumps are directly connected to a printed circuit board, and wherein an inductor is fixed to the printed circuit board and is coupled to the second microbump.

15. An integrated circuit comprising:
    four microbumps disposed on a major surface of the integrated circuit, wherein the four microbumps are arranged in a square pattern such that one of the four microbumps is disposed at a respective corner of the square, and wherein there are no microbumps other than the four microbumps disposed on the major surface within the square;
    a buck converter having a P-channel transistor, an N-channel transistor, and a control circuit, wherein a first of the four microbumps is connected to a source of the P-channel transistor, wherein a drain of the P-channel transistor is connected to a drain of the N-channel transistor and to a second of the four microbumps, wherein a source of the N-channel transistor is connected to a third of the four microbumps, and wherein a fourth of the four microbumps is connected to a feedback input of the control circuit; and additional microbumps disposed on the major surface of the integrated circuit, wherein the additional microbumps and the four microbumps are arranged on a regular grid, and wherein the buck converter receives control signals through the additional microbumps.

16. The integrated circuit of claim 1, wherein the additional microbumps and the four microbumps are electrically conductive.

17. An integrated circuit comprising:
four microbumps disposed on a major surface of the integrated circuit, wherein the four microbumps are directly connected to a printed circuit board, wherein the four microbumps are arranged in a square pattern such that one of the four microbumps is disposed at a respective corner of the square, and wherein there are no microbumps other than the four microbumps disposed on the major surface within the square; and a buck converter having a P-channel transistor, an N-channel transistor, and a control circuit, wherein a first of the four microbumps is connected to a source of the P-channel transistor, wherein a drain of the P-channel transistor is connected to a drain of the N-channel transistor and to a second of the four microbumps, wherein a source of the N-channel transistor is connected to a third of the four microbumps, wherein a fourth of the four microbumps is connected to a feedback input of the control circuit, and wherein an inductor is fixed to the printed circuit board and is coupled to the second of the four microbumps.

18. The integrated circuit of claim 17, wherein the four microbumps are electrically conductive.

19. An integrated circuit comprising:
four microbumps disposed on a major surface of the integrated circuit, wherein the four microbumps are directly connected to a printed circuit board, wherein the four microbumps are arranged in a square pattern such that one of the four microbumps is disposed at a respective corner of the square, and wherein there are no microbumps other than the four microbumps disposed on the major surface within the square;

a buck converter having a P-channel transistor, an N-channel transistor, and a control circuit, wherein a first of the four microbumps is connected to a source of the P-channel transistor, wherein a drain of the P-channel transistor is connected to a drain of the N-channel transistor and to a second of the four microbumps, wherein a source of the N-channel transistor is connected to a third of the four microbumps, wherein a fourth of the four microbumps is connected to a feedback input of the control circuit, and wherein an inductor is fixed to the printed circuit board and is coupled to the second of the four microbumps; and a first interconnection bus portion, wherein the four microbumps, the buck converter and the first interconnection bus portion are part of a first tile of the integrated circuit, and wherein the first interconnection bus portion links up with a second interconnection bus portion of a second tile of the integrated circuit.

20. The integrated circuit of claim 19, further comprising:
an additional microbump, wherein signals received on the additional microbump determine how the buck converter is configured.

21. The integrated circuit of claim 19, further comprising:
an additional microbump disposed on the second tile, wherein signals received on the additional microbump and conveyed to the first tile via the second interconnection bus portion and the first interconnection bus portion determine how the buck converter is configured.

22. The integrated circuit of claim 19, further comprising:
a non-volatile memory that stores configuration information that configures the buck converter.

23. The integrated circuit of claim 19, further comprising:
an additional microbump that outputs a signal that indicates when a regulated voltage on the second of the four microbumps meets a predetermined criteria.

24. The integrated circuit of claim 19, further comprising:
an additional microbump that receives a signal that determines a current limit of the buck converter.

25. The integrated circuit of claim 19, wherein the second of the four microbumps is coupled to a first lead of the inductor, and wherein the fourth of the four microbumps is coupled to a second lead of the inductor.

26. An integrated circuit comprising:
four microbumps disposed on a major surface of the integrated circuit, wherein the four microbumps are arranged in a pattern such that one of the four microbumps is disposed at a respective corner of the pattern, wherein there are no microbumps other than the four microbumps disposed on the major surface within the pattern, and wherein the pattern is taken from the group consisting of: a parallelogram shape and a diamond shape;

a buck converter having a P-channel transistor, an N-channel transistor, and a control circuit, wherein a first of the four microbumps is connected to a source of the P-channel transistor, wherein a drain of the P-channel transistor is connected to a drain of the N-channel transistor and to a second of the four microbumps, wherein a source of the N-channel transistor is connected to a third of the four microbumps, and wherein a fourth of the four microbumps is connected to a feedback input of the control circuit; and additional microbumps disposed on the major surface of the integrated circuit, wherein the additional microbumps and the four microbumps are arranged on a regular grid, and wherein the buck converter receives control signals through the additional microbumps.

27. The integrated circuit of claim 26, wherein the additional microbumps and the four microbumps are electrically conductive.

* * * * *